United States Patent [19]

Loeppert

[11] Patent Number: 5,490,220
[45] Date of Patent: Feb. 6, 1996

[54] SOLID STATE CONDENSER AND MICROPHONE DEVICES

[75] Inventor: Peter V. Loeppert, Hoffman Estates, Ill.

[73] Assignee: Knowles Electronics, Inc., Itasca, Ill.

[21] Appl. No.: 238,965

[22] Filed: May 5, 1994

Related U.S. Application Data

[63] Continuation-in-part of Ser. No. 853,488, Mar. 18, 1992, abandoned.

[51] Int. Cl.[6] .................................................. H04R 25/00
[52] U.S. Cl. ....................... 381/168; 381/173; 381/113; 381/191
[58] Field of Search ............................ 381/113, 116, 381/191, 173, 174, 168; 310/324

[56] References Cited

U.S. PATENT DOCUMENTS

| | | | |
|---|---|---|---|
| 3,626,096 | 12/1971 | von Muench | 381/174 |
| 3,663,768 | 5/1972 | Madsen et al. | 381/174 |
| 3,772,133 | 11/1973 | Schmitt | 161/112 |
| 3,991,285 | 11/1976 | Van Den Worm et al. | 179/111 E |
| 4,491,697 | 1/1985 | Tanaka et al. | 381/174 |
| 4,651,120 | 3/1987 | Aagard | 338/4 |
| 4,783,821 | 11/1988 | Muller et al. | 381/173 |
| 4,993,072 | 2/1991 | Murphy | 381/113 |
| 5,146,435 | 9/1992 | Bernstein | 381/174 |

FOREIGN PATENT DOCUMENTS

| | | |
|---|---|---|
| 0341964 | 11/1989 | European Pat. Off. . |
| 2202800 | 10/1990 | Japan . |
| WO83/01362 | 4/1983 | WIPO . |

OTHER PUBLICATIONS

D. Hohm and G. Hess, "A Subminiature Condenser Microphone with Silicon Nitride Membrane and Silicon Back Plate," *J. Acoust. Soc. Am.* 85(1), (Jan. 1989) pp. 476–480.

J. Bergqvist and F. Rudolf, "A Silicon Condenser Microphone with a Highly Perforated Backplate," *Transducers '91—1991 Int'l Conf. on Solid State Sensors and Activators,* IEEE (1991) pp. 266–269.

G. M. Sessler, "Acoustic Snesors," *Sensors and Actuators A.* 25–27 (1991) pp. 323–330 *Technical University of Darmstadt, Darmstadt (F.R.G.).*

Primary Examiner—Curtis Kuntz
Assistant Examiner—Sinh Tran
Attorney, Agent, or Firm—Wallenstein & Wagner, Ltd.

[57] ABSTRACT

A solid state miniature condenser and condenser microphone of good sensitivity is disclosed. The microphone comprises a fixed perforated backplate that constitutes a fixed electrode in a parallel plate condenser, a diaphragm sensitive to incident sound pressure waves that constitutes a moveable plate in the parallel plate condenser, keepers to position the diaphragm in relationship to the backplate without applying appreciable tension to the diaphragm, and FET circuitry which provides an output proportional to the change in capacitance of the condenser when the diaphragm moves in relationship to the backplate.

22 Claims, 5 Drawing Sheets

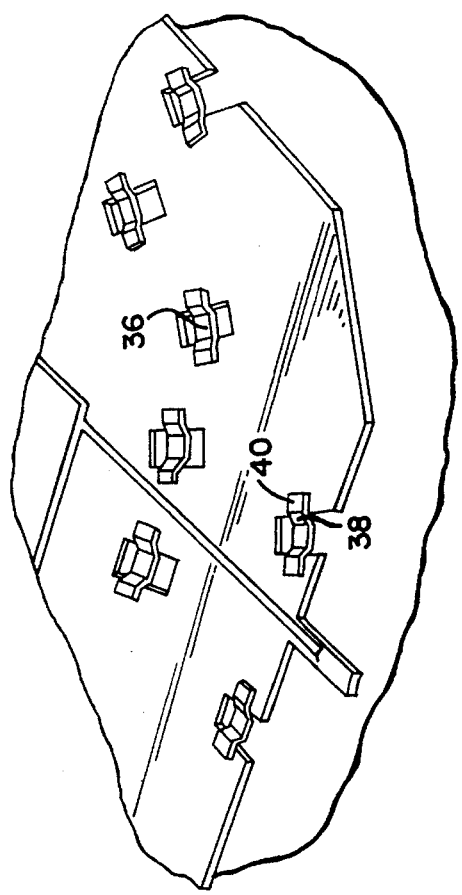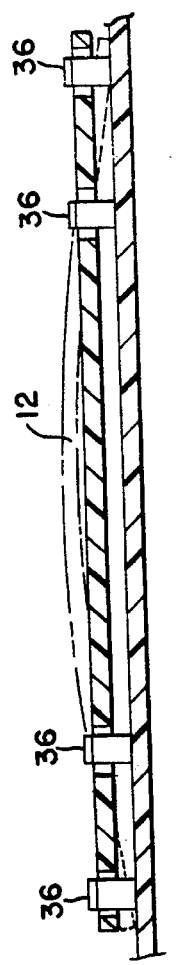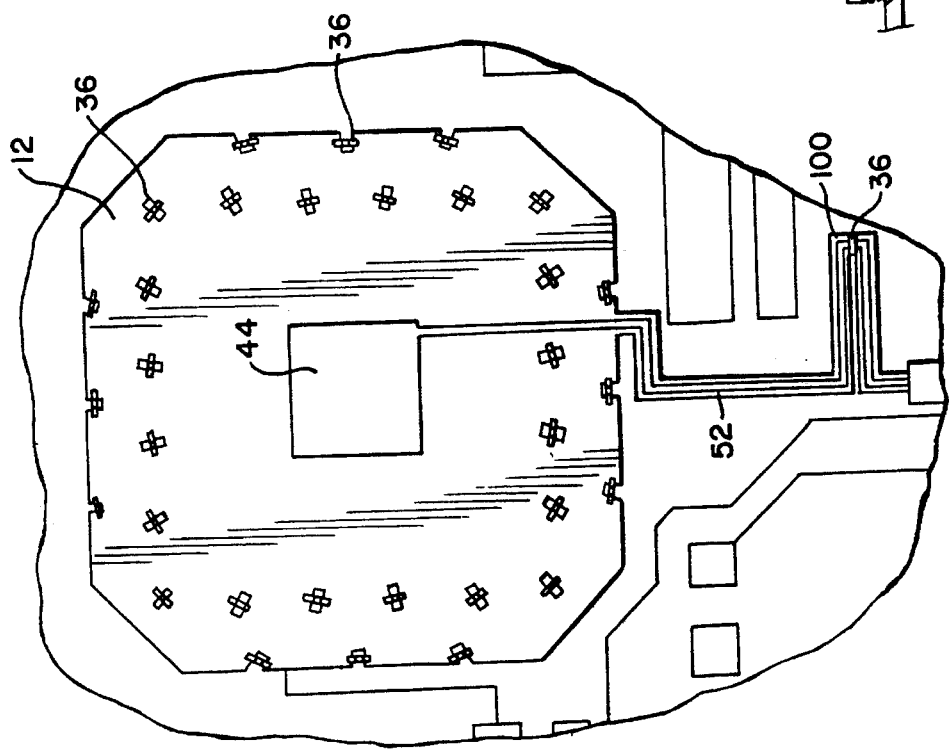

SOLID STATE CONDENSER AND MICROPHONE DEVICES

This is a continuation-in-part of application Ser. No. 07/853,488, filed on Mar. 18, 1992, now abandoned.

FIELD OF THE INVENTION

This invention relates to solid state condensers. More particularly, it relates to a miniature solid state condenser microphone useful in applications where small dimensions are desired, such as for sensors in hearing aids.

BACKGROUND OF THE INVENTION

A typical condenser microphone is composed of a voltage bias element, Vbias, (commonly an electret), a diaphragm/backplate pair forming a capacitor which varies with sound pressure, and a Field Effect Transistor (FET) circuit for buffering the output signal. Miniature microphones used in hearing aids and other applications are typically electret condenser microphones. These are built with highly precision stamped metal parts, organic diaphragm films such as mylar and polyester, and highly charged electret films to bias the microphones. These microphones have certain shortcomings. Their size has been reduced to the limits of manufacturability. Lack of uniformity in the stamping and assembly processes results in a large variability in sensitivity. Furthermore, temperature and humidity effects on the organic diaphragm film and electret result in long term drift in microphone performance.

In attempts to overcome the difficulties associated with traditional miniature microphones, various workers have tried to make solid state microphones using semi-conductor techniques. Such microphones using inorganic thin films have the potential to overcome the problems associated with conventional miniature microphones. However, attempts to build such solid state microphones have not been successful in achieving the necessary sensitivity simultaneously with good manufacturability.

Conventional microphones have rectangular diaphragm/backplate pairs typically measuring several millimeters on a side with a spacing between the diaphragm and the backplate of several tens of microns. An electret bias of several hundred volts is required to bring the microphone sensitivity to the desired range. In designing a solid state microphone, for example one from silicon, it is desirable to reduce the bias voltage to the 5 to 10 volt range in order to eliminate environmental stability problems with the electret. This voltage can conveniently be developed directly from the power supply or with conventional charge pump circuitry. Reducing the bias voltage value requires a commensurate increase in the ratio of the change of capacitance ($\Delta C$) to the capacitance (C) to maintain equivalent sensitivity. One method of maintaining the sensitivity of the miniature microphone is to reduce the gap between the diaphragm and the backplate to about 1 to 2 microns. It is also necessary to keep the mechanical compliance of the diaphragm (i.e., deflection vs. sound pressure level) to a level at least comparable to that in conventional microphones.

In a diaphragm there are two kinds of forces which resist deflection in response to pressure. The first kind of force includes plate bending forces which are proportional to the thickness of the diaphragm. These forces can be reduced by using a very thin film diaphragm. The second kind of forces which resist deflection include membrane forces which are proportional to the tension applied to the diaphragm. In the case of a thin film diaphragm, tension is not generally put in intentionally but is a result of the fabrication technique and of mismatches in thermal expansion coefficients between the diaphragm and the particular means utilized to hold the diaphragm in place.

Previous workers who have prepared solid state microphones have recognized the problem of residual tension in the diaphragm. *Hohm and Hess, J. Acoust. Soc. Am.* 85, 476–480 (1989) used a flat silicon nitride diaphragm with large residual tension. To reduce the tension, they implanted nitrogen to relax the nitride film. However, this technique is sensitive to implant dosage and energy, and to the thermal annealing cycle. It is difficult to control uniformity of the original tension across such a diaphragm and such a process may not impart long term stability to the diaphragm.

*Bergqvist and Rudolf, Transducers* 91, *Proceedings of the International Conference on Solid-State Sensors and Actuators* (IEEE, New York, 1991) pp.266–269, reduced membrane forces in a different fashion. They established a low tension diaphragm by using lightly doped single crystal silicon. While this was successful in reducing membrane tension, a parasitic capacitance was formed which canceled the advantage of the low stress diaphragm.

The present invention is provided to solve these and other problems.

SUMMARY OF THE INVENTION

It is an object of the present invention to provide a solid state microphone which can be made smaller than conventional microphones and which has a tightly controlled sensitivity.

It is a further objective of the present invention to produce a solid state microphone with reduced membrane forces and with very low parasitic capacitance.

In accordance with the present invention there is provided a solid state condenser device comprising a fixed backplate constituting a fixed electrode in a parallel plate condenser, and a diaphragm having a thickness. The diaphragm is sensitive to incident sound pressure waves and constitutes a moveable electrode in the parallel plate condenser. The device further includes a keeper having a keeper gap to receive the diaphragm in operative positional relationship with the backplate. The keeper gap has a thickness greater than the thickness of the diaphragm to retain the diaphragm without physical attachment thereto. This construction avoids applying appreciable tension to the diaphragm.

It is contemplated that the backplate is perforated.

It is further contemplated that there are a plurality of keepers disposed in spaced relationship about the periphery of the diaphragm.

It is still further contemplated that there are a plurality of keepers disposed in spaced relationship radially inward of the periphery of the diaphragm.

Other features and advantages of the invention will be apparent from the following specification taken in conjunction with the following drawings.

BRIEF DESCRIPTION OF THE DRAWINGS

FIG. 8 is a plan view of an alternative embodiment of the present invention;

FIG. 9 is a perspective view of the embodiment of FIG. 8; and

FIG. 10 is a sectional view of the embodiment of FIG. 8 generally illustrating forces acting on the diaphragm.

DETAILED DESCRIPTION

Figure 1A:
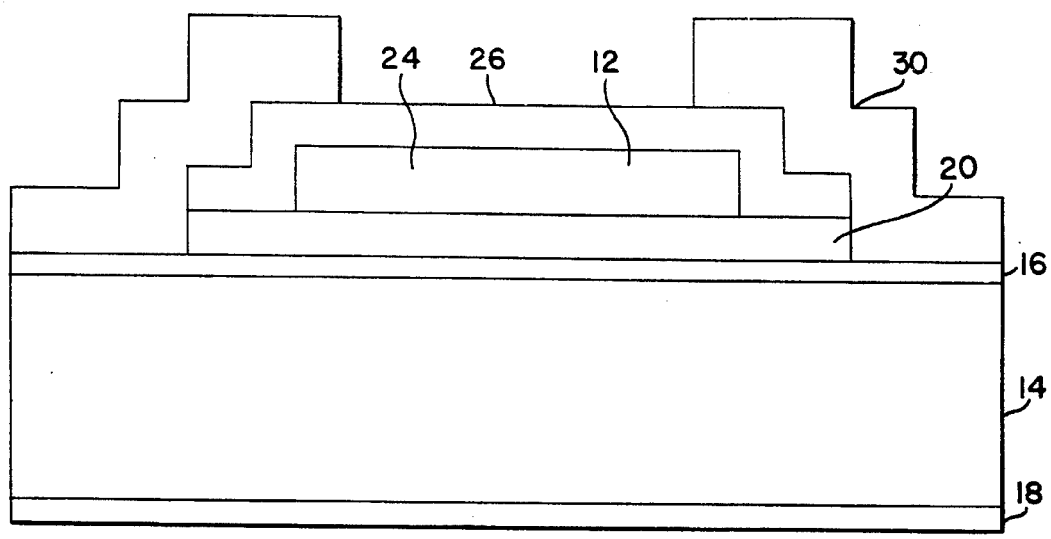
FIGS. 1a and 1b are cross section views illustrating preparation of a diaphragm according to one embodiment of this invention.

While this invention is susceptible of embodiments in many different forms, there is shown in the drawings and will herein be described in detail, preferred embodiments of the invention with the understanding that the present disclosure is to be considered as exemplifications of the principles of the invention and is not intended to limit the broad aspects of the invention to the embodiments illustrated.

Solid state microphones of the prior art have employed a diaphragm whose edges were all solidly attached to the condenser. Such a solid attachment applies tension to a thin membrane during its fabrication. The present invention is based on the discovery that if the diaphragm is only loosely constrained, little tension is built up in the diaphragm. As a result, the diaphragm shows greater sensitivity in its response to sound pressure.

Figure 1B:
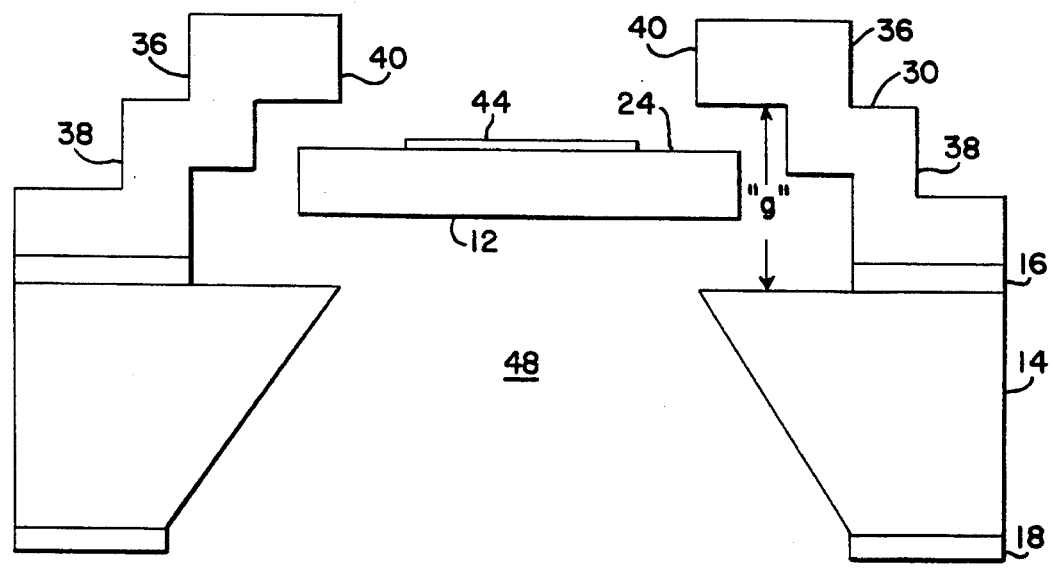

A diaphragm, generally designated 12, with low tension can be prepared by the method illustrated in FIGS. 1a and 1b. A double side polished <100> orientated silicon wafer 14 is oxidized with first and second, 400 Å layers of oxide 16, 18, on respective sides of the wafer 14. Then a 1000 Å layer of aluminum 20 is deposited on the first oxide layer 16 by evaporation. Alternatively, a layer of polycrystalline silicon (poly) deposited by low pressure chemical vapor deposition could be substituted for the aluminum layer 20. A first, one micron layer of silicon nitride 24 is next deposited by plasma enhanced chemical vapor deposition (PECVD) on the aluminum layer 20, and etched to form the diaphragm 12. A second, 1000 Å sacrificial layer of aluminum 26 is deposited by evaporation on top of the silicon nitride layer 24. The first and second aluminum layers 20, 26, are etched about their periphery, just beyond the edge of the silicon nitride layer 24. This etch forms the peripheral "stepped" profile of the aluminum layers 20, 24, to expose the oxide layers 16 for attachment of a second nitride layer 30.

The second layer of PECVD nitride 30 is 1.5 microns thick and is deposited and subsequently etched to form thin-film dielectric keepers 36. The keepers 36 include a keeper support 38 and a keeper arm 40. As discussed below, the keepers 36 receive the diaphragm 12, to maintain the diaphragm 12 in place without imposing any significant stress on the diaphragm 12. The figures are not to scale, since the thickness of the silicon wafer 14 is very large in comparison with the other layers.

Figure 2:
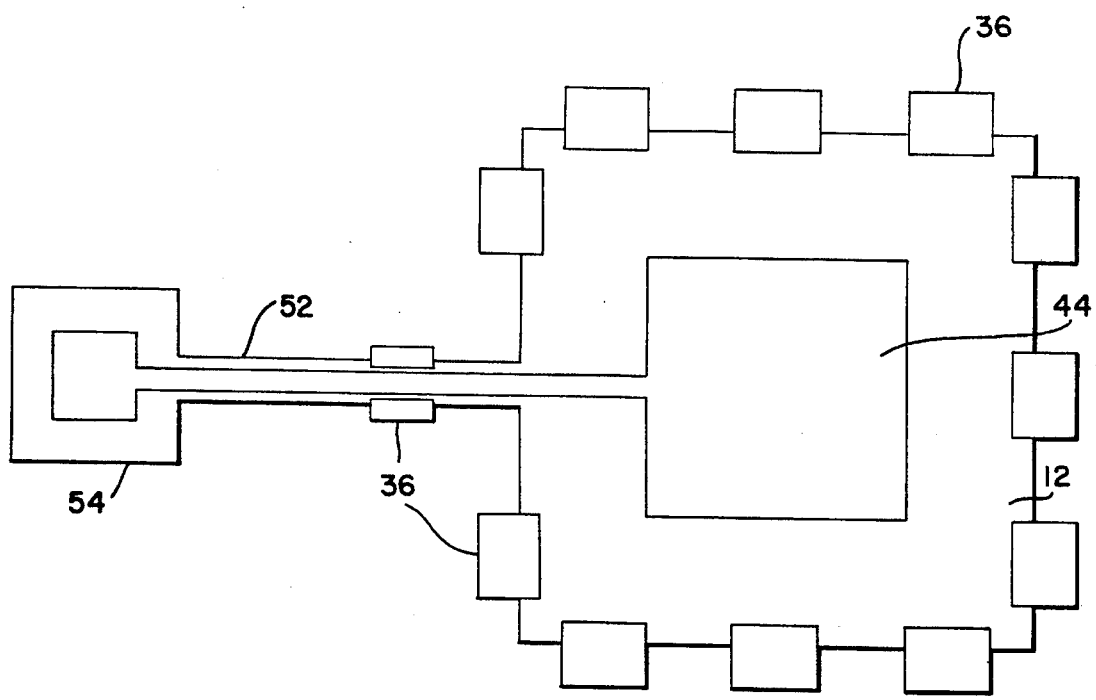
FIG. 2 is a plan view of the diaphragm of FIG. 1b.

FIG. 2 shows a top view of the diaphragm 12 with the keepers 36 in place. The keepers 36 are small, separate elements so that their internal stresses do not cause cracking of the keepers 36 or the rest of the structure. These keepers can take a variety of shapes.

To complete fabrication of the diaphragm 12, the second aluminum layer 26 on top of the diaphragm 12 is stripped away, and a connecting layer 44 is formed by depositing a layer of chrome/gold metal the diaphragm 12, as illustrated in FIG. 1b. The gold of the chrome/gold metal is etched off the diaphragm surface resulting in the connecting layer 44 comprising a very thin chrome layer (100–200 Å in thickness). The connecting layer 44 serves to connect the diaphragm 12 with other circuitry on the wafer 14. The second oxide layer 18 on the backside of the wafer 14 is then etched to serve as a mask for a cavity etch discussed below.

To perform the cavity etch, the wafer 14 is soaked in an anisotropic etchant such as EDP, to create a cavity 48. An aluminum etchant is used to etch away the first and second aluminum layers 20, 26, respectively, freeing the diaphragm. A final dip in buffered HF solution removes the first oxide layer 16 from under the diaphragm 12.

As illustrated in FIG. 1b, the diaphragm has a thickness "t", and the keeper 36 defines a gap having a gap thickness "g". The gap receives the diaphragm 12 in operative relation to the backplate, to maintain the diaphragm without actual attachment thereto. Thus, the diaphragm is maintained in place without applying any appreciable tension on the diaphragm 12.

A top view of the diaphragm 12 is shown in FIG. 2. The diaphragm 12 includes an elongated tail member 52 which extends off to one side and which terminates in a square pad 54 that is fixed to the silicon substrate. As noted above, the gold of the chrome/gold metal is removed from the diaphragm surface 12. However, the gold is permitted to remain at the pad 54 to permit connections, as is well known. While the tail member 52 is free floating, it is restricted in movement by the silicon substrate below and the keepers above.

The connecting layer 44 on the diaphragm 12 is restricted to the central region of the diaphragm 12, where diaphragm deflection is greatest. This location maximizes sensitivity of the microphone and minimizes parasitic capacitance between the diaphragm 12 and the rest of the structure. Because the diaphragm 12 is insulated from the silicon substrate, parasitic capacitance is further reduced by application of a guard voltage, derived from the output of an FET circuit, to the substrate.

Figure 3:
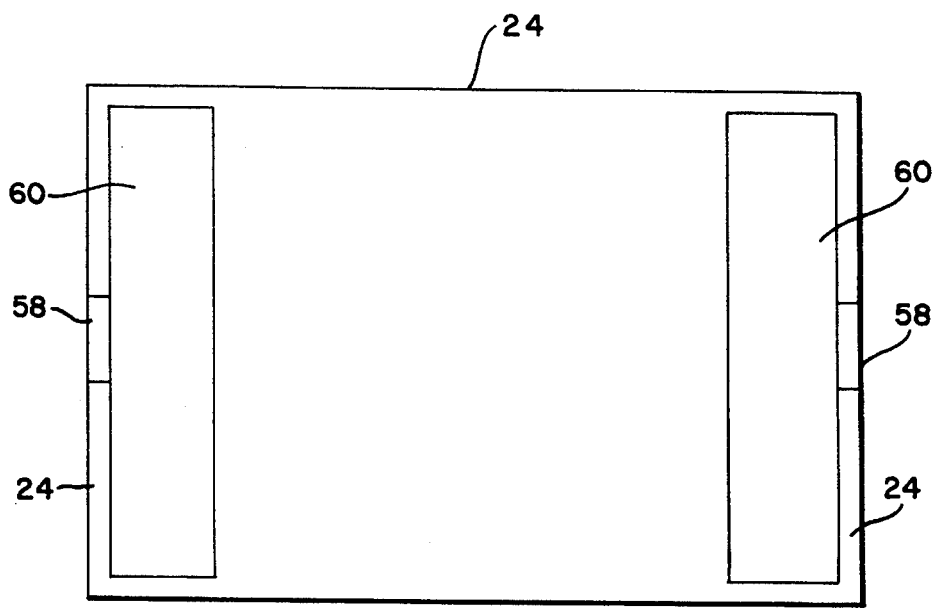
FIG. 3 is a plan view of a diaphragm according to another embodiment of this invention.

Referring to FIG. 3, a plan view of a diaphragm 12 illustrates another embodiment of this invention. The diaphragm 12 is not retained by means of the keepers 36, as is the one illustrated in FIGS. 1 and 2. Rather, two small regions 58 of the diaphragm 12 are attached to the silicon oxide layer. Portions of the diaphragm 12 adjacent to the small regions 58 are etched away, leaving holes 60 in the diaphragm 12. This procedure produces long thin arms 62 extending from the regions 58 of the diaphragm 20, which is attached to the silicon oxide layer. The arms 62 act as springs which can easily flex and reduce tension in the diaphragm 12. Similar structures would be obvious to those skilled in the art. The diaphragm 12 illustrated in FIG. 3 has a simpler fabrication sequence over that shown in FIGS. 1 and 2. However, this diaphragm is not constrained in the vertical direction as much as that shown in FIGS. 1 and 2 and hence is subject to more breakage during the etching step to free it.

Figure 4:
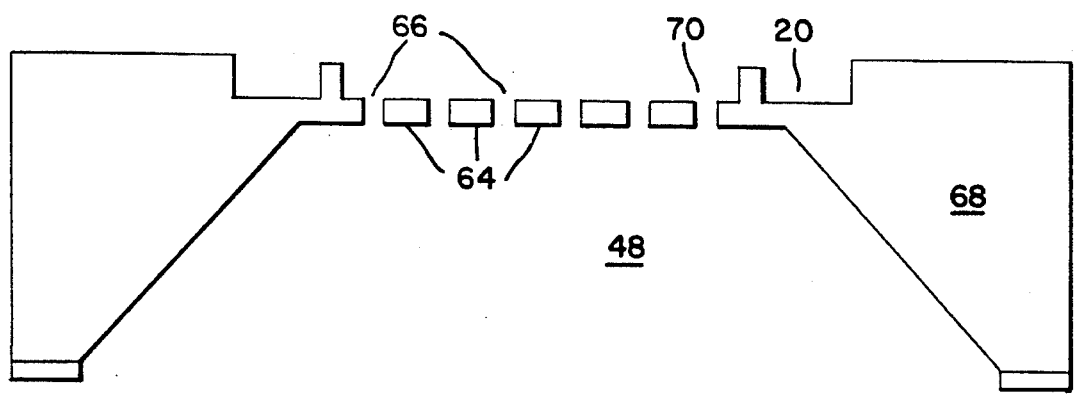
FIG. 4 is a cross section view of a backplate in accordance with an embodiment of this invention.

The design of a backplate used in the practice of this invention is best seen by reference to FIG. 4, which shows in cross section a backplate 64 prepared by etching a silicon wafer. The backplate 64 has a plurality of perforations 66 to minimize stiffness due to air trapped between the diaphragm 12 and the backplate 64. The backplate 64 is prepared from a silicon chip which has been heavily doped with boron. This puts the backplate 64 under tension, enhances conductivity, and serves as an etch stop to create needed geometry. Bergqvist, mentioned above, pointed out the need for a highly perforated backplate. However, he incorrectly identified the need for a low stress in the backplate by using lightly doped single crystal silicon. Actually, a stiff backplate is preferred, since it gives the highest possible relative motion between the diaphragm and the backplate.

Fabrication of the backplate 64 begins with a double polished, <100> oriented silicon wafer 68 on which a nitride layer is deposited and etched to mask a shallow gap 70. The shallow gap 70 is etched about 2 microns deep into the silicon with an anisotropic etchant. The remaining nitride is removed and a new layer is deposited and etched to leave tiny islands positioned over the locations where the holes 72 are desired. A heavy boron dose is diffused into the front surface to form a $p^+$ etch stop approximately 4 microns deep. The nitride on the back of the wafer resulting from the second deposition, is etched to serve as a mask for the cavity etch. Soaking the wafer in an isotropic etchant such as EDP forms the cavity 48, resulting in the perforated backplate 64.

As an alternate method to fabricate the backplate 64, rather than etching to form the gap 70, the periphery of the wafer 68 is built up by the deposition of various thin films, as is well known, to establish the gap 70.

Figure 5:
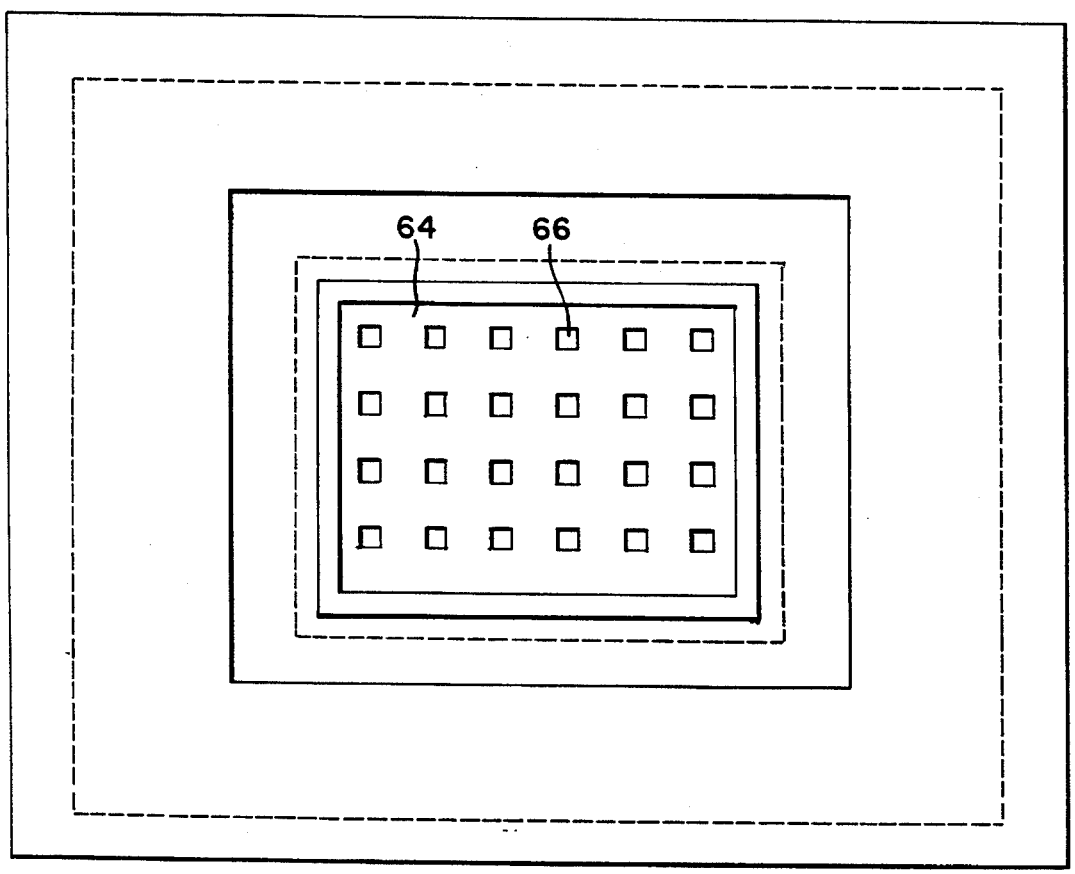
FIG. 5 is a plan view of the backplate of FIG. 4.

FIG. 5 shows a plan view of the backplate 64. In this figure, a comparatively small number of the holes 76 are illustrated. However, in practicing this invention, it is frequently convenient to prepare a backplate with many more perforations.

Figure 6:
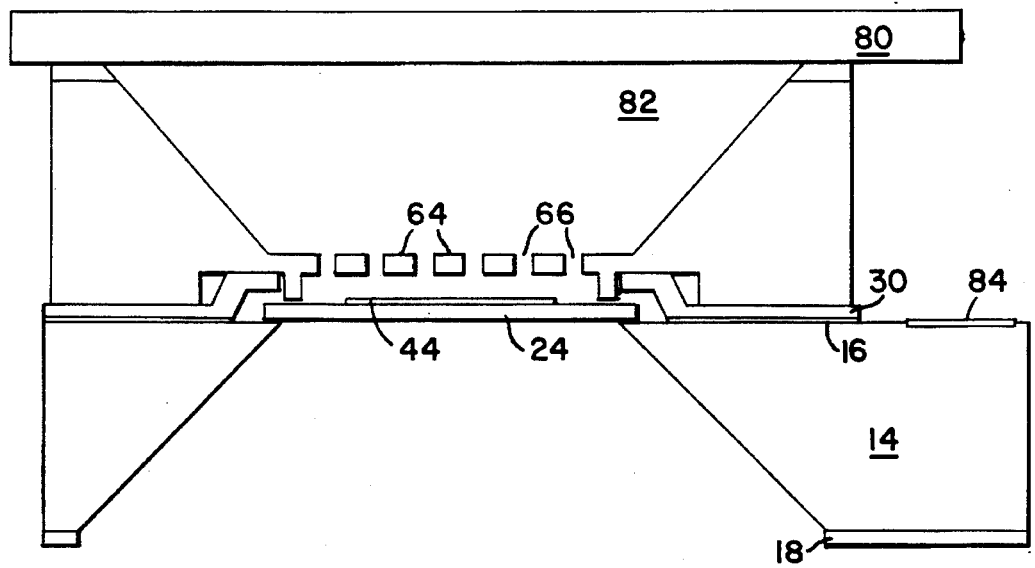
FIG. 6 is a cross section view of a condenser according to an embodiment of this invention.

In accordance with this invention, the diaphragm and backplate are bonded together using one of the common techniques such as eutectic soldering, electrostatic bonding, or silicon fusion bonding. A bonded pair is shown in cross section in FIG. 6. In order to complete the unit for use in a microphone, the combination of diaphragm and backplate is mounted on a support 80 which serves to form, with the backplate 64, a closed backchamber 82. FET circuitry 84 as well as a bias source (not shown) is readily integrated on one of the silicon pieces to form a complete microphone element.

Figure 7:
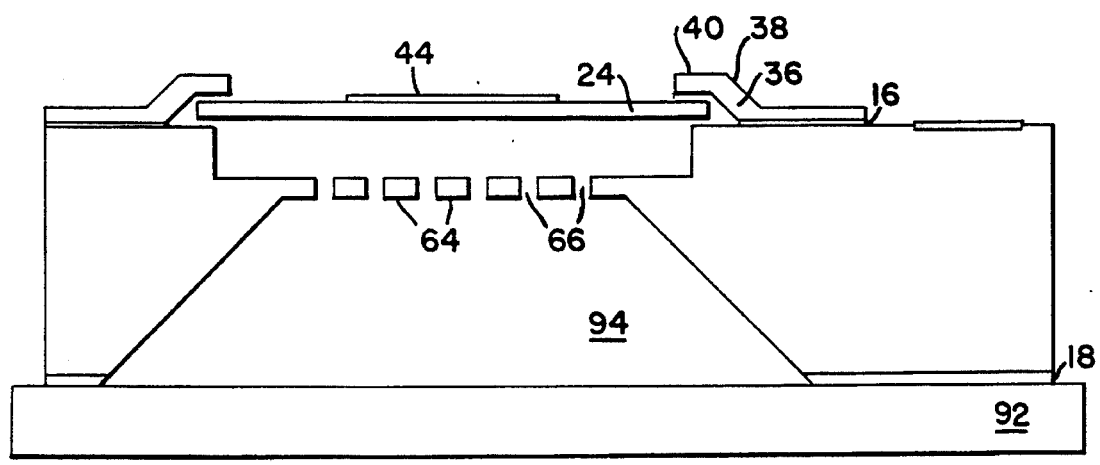
FIG. 7 is a cross section view of a condenser in accordance with another embodiment of this invention.

In accordance with a further aspect of the invention, the diaphragm 12 and the backplate 64 can be formed on a single silicon wafer, as illustrated in FIG. 7. In this embodiment, the backplate 64 is defined first using the boron doping process discussed above with respect to FIG. 4, without first forming the shallow gap. After the boron doping, a lightly doped polycrystalline silicon layer is deposited. The front surface of the wafer remains relatively planar, and the $p^+$ etch stop is now buried below the surface. The diaphragm 12 and the keepers 36 are next fashioned on the silicon wafer 14 using the same general procedure discussed above with respect to FIGS. 1a and 1b. When the wafer 14 is soaked in EDP to form the cavity 48, the sacrificial layers are removed to free the diaphragm 12 and the gap is created. The silicon wafer containing the backplate 64 is attached to a base 92 to provide a closed backchamber 94. FET circuitry and a voltage bias source are integrated on the silicon piece to form a complete microphone element.

In carrying out this invention, it is necessary to avoid acoustical leaks around the diaphragm between the sound source and back-chamber 42. Such acoustical leaks are prevented in the device in FIG. 7 because peripheral edges of the diaphragm 12 contact the silicon wafer 14 as it moves towards the backplate by electrostatic attraction created by the bias voltage. In the device illustrated in FIG. 6, an acoustical leak is prevented by means of a ring 96 in the backplate member which engages the diaphragm 12 as the diaphragm 12 moves toward the backplate 64 under the same electrostatic attraction. However, these devices permit low frequency airflow from the back-chamber to compensate for any static pressure differences between the back-chamber and the environment.

A modification to the embodiment of FIGS. 1a, 1b, and 2 is illustrated in FIGS. 8 and 9. According to this modified embodiment, the keepers 36 about the periphery of the diaphragm 12, as well as keepers 36 which are disposed radially inward of the periphery of the diaphragm 12, are utilized. The keepers 36 of this embodiment are manufactured similar to the keepers 36 of FIGS. 1 and 2, discussed above, except that the keepers 36 of this embodiment each include a pair of keeper arms 40. Additionally, the tail member 52 is configured with a U-shaped portion 100, also received by a keeper 36. The U-shaped portion 100 flexes to allow the diaphragm 12 to move in the direction of the tail member 52, further providing the diaphragm 12 with a greater degree of movement to further reduce tension.

FIG. 10 is a cross section of the embodiment of FIGS. 8 and 9. As illustrated, the keepers 36 cooperate to restrict flexing of the diaphragm 12, while eliminating the tension induced by rigid clamping.

The present invention has been described with respect to certain embodiments and conditions, which are not meant to limit the invention. Those skilled in the art will understand the variations from the embodiments and conditions described herein may be made without departing from the invention as set forth in the appended claims.

I claim:

1. A solid state condenser device comprising:
   a backplate constituting a fixed electrode in a parallel plate condenser;
   a diaphragm having a thickness, said diaphragm being sensitive to incident sound pressure waves, said diaphragm constituting a moveable electrode in said parallel plate condenser; and
   means comprising a keeper, said keeper being formed of a thin-film dielectric and having a keeper gap to receive said diaphragm in operative positional relationship with said backplate, said keeper gap having a thickness greater than the thickness of said diaphragm to retain said diaphragm without physical attachment thereto, to avoid applying appreciable tension to said diaphragm.

2. The device of claim 1 wherein said backplate is perforated.

3. The device of claim 1 wherein said keeper is disposed at the periphery of said diaphragm.

4. The solid state condenser device of claim 1 wherein the means to retain the diaphragm includes clamps and a tail member fixed to the backplate.

5. The device of claim 1 wherein said keeper support extends from said keeper arm at an angle of substantially 90 degrees.

6. The device of claim 1 including a plurality of said keepers disposed about the periphery of said diaphragm.

7. The device of claim 6 wherein said plurality of keepers are substantially equally spaced about the periphery of said diaphragm.

8. The device of claim 1 wherein said keeper is disposed radially inward of the periphery of said diaphragm.

9. The device of claim 1 including a plurality of said keepers disposed radially inward of the periphery of said diaphragm.

10. The solid state condenser microphone device of claim 7 wherein the means to retain the diaphragm includes clamps and a tail member fixed to the backplate.

11. A solid state condenser device comprising:

a fixed backplate constituting a fixed electrode in a parallel plate condenser;

a diaphragm having a thickness, said diaphragm being sensitive to incident sound pressure waves, said diaphragm constituting a moveable electrode in said parallel plate condenser; and means comprising a plurality of keepers, each of said keepers being formed of a thin-film dielectric and having a keeper gap to receive said diaphragm in operative positional relationship with said backplate, said keeper gap having a thickness greater than the thickness of said diaphragm to retain said diaphragm, without physical attachment thereto to avoid applying appreciable tension to said diaphragm.

12. The device of claim 11 wherein said backplate is perforated.

13. The device of claim 11 wherein said plurality of keepers are disposed about the periphery of said diaphragm.

14. The device of claim 13 wherein said plurality of keepers are equally spaced about the periphery of said diaphragm.

15. The device of claim 11 wherein said plurality of keepers are disposed radially inward of the periphery of said diaphragm.

16. A solid state condenser device comprising:

a fixed perforated backplate which constitutes a fixed electrode in a parallel plate condenser;

a diaphragm sensitive to incident sound pressure waves which constitutes a moveable electrode in said parallel plate condenser; and means to retain said diaphragm in operative relation to said backplate without applying appreciable tension to said diaphragm, said retaining means comprising a plurality of keepers, each of said keepers being formed of a thin-film dielectric and having a keeper gap to receive said diaphragm, said keeper gap having a thickness greater than the thickness of said diaphragm to retain said diaphragm.

17. The solid state condenser microphone device of claim 14 wherein the means to retain the diaphragm clamps and a tail member fixed to the backplate.

18. The solid state condenser device of claim 16 wherein the diaphragm is a silicon nitride diaphragm.

19. A solid state condenser microphone device prepared on a single silicon wafer which comprises:

a fixed perforated backplate, prepared from said silicon wafer, which constitutes a fixed electrode in a parallel plate condenser;

a diaphragm sensitive to incident sound pressure waves which constitutes a moveable electrode in said parallel plate condenser;

means to retain said diaphragm in operative relation to said backplate without applying appreciable tension to said diaphragm, wherein the diaphragm is retained in relation to said backplate by a plurality of thin-film dielectric keepers fixed to the backplate; and a Field Effect Transistor circuit electrically connected to said backplate and said diaphragm to provide an output when said diaphragm moves in relationship to said backplate.

20. The solid state condenser microphone device of claim 19 wherein the backplate is prepared from a boron doped silicon wafer.

21. The solid state condenser microphone device of claim 19 wherein the diaphragm is a silicon nitride diaphragm.

22. The solid state condenser microphone device of claim 19 wherein the Field Effect Transistor circuitry is integrated on the silicon wafer.

* * * * *